(12) United States Patent
Kinbara et al.

(10) Patent No.: US 6,222,862 B1
(45) Date of Patent: Apr. 24, 2001

(54) CONTROL METHOD OF EXCITING A PULSE LASER AND POWER SUPPLY UNIT FOR EXCITING A PULSE LASER

(75) Inventors: Yoshihide Kinbara; Shinji Sato, both of Nagoya (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/119,940

(22) Filed: Jul. 21, 1998

(30) Foreign Application Priority Data

Oct. 31, 1997 (JP) .................................................. 9-301153

(51) Int. Cl.[7] .............................. H01S 3/10; H01S 3/00; H01S 3/097; H02M 7/00; H02M 5/00
(52) U.S. Cl. ................................ 372/38; 372/28; 372/81; 363/65; 363/165
(58) Field of Search .............................. 372/28, 38, 81; 363/165, 65

(56) References Cited

U.S. PATENT DOCUMENTS

| | | | |
|---|---|---|---|
| 5,740,023 | * | 4/1998 | Brooke et al. .......................... 363/65 |
| 5,883,797 | * | 3/1999 | Amaro et al. .......................... 363/65 |
| 5,946,206 | * | 8/1999 | Shimizu et al. ....................... 363/65 |
| 6,088,248 | * | 7/2000 | Schenk et al. ......................... 363/65 |
| 6,091,749 | * | 7/2000 | Hoffmaster et al. .................... 372/38 |

FOREIGN PATENT DOCUMENTS

| | | | |
|---|---|---|---|
| 3014220 | * | 4/1980 | (DE) . |
| 30-14220 | | 10/1980 | (DE) . |
| 32-16186 | | 11/1982 | (DE) . |
| 0716485 | * | 11/1995 | (EP) . |
| 1-93188 | | 4/1989 | (JP) . |
| 7-44039 | | 10/1995 | (JP) . |
| 11135870 | * | 10/1997 | (JP) . |

* cited by examiner

Primary Examiner—Frank G. Font
Assistant Examiner—Armando Rodriguez
(74) Attorney, Agent, or Firm—Sughrue, Mion, Zinn, Macpeak & Seas, PLLC

(57) ABSTRACT

A power supply unit provides therein a first power unit outputting a first excitation amplitude and operating from rising of a reference pulse signal outputted from a reference oscillator until rising of a first time delay signal having a time delay to the reference pulse signal, a second power unit outputting a second excitation amplitude and operating from rising of the first time delay signal until rising of a second time delay signal having a time delay to the first time delay signal, and a third power unit outputting a third excitation amplitude and operating from rising of the second time delay signal until falling of the first time delay signal, and supplies output by synthesizing output from the first power unit, second power unit and the third power unit to the exciting unit.

22 Claims, 17 Drawing Sheets

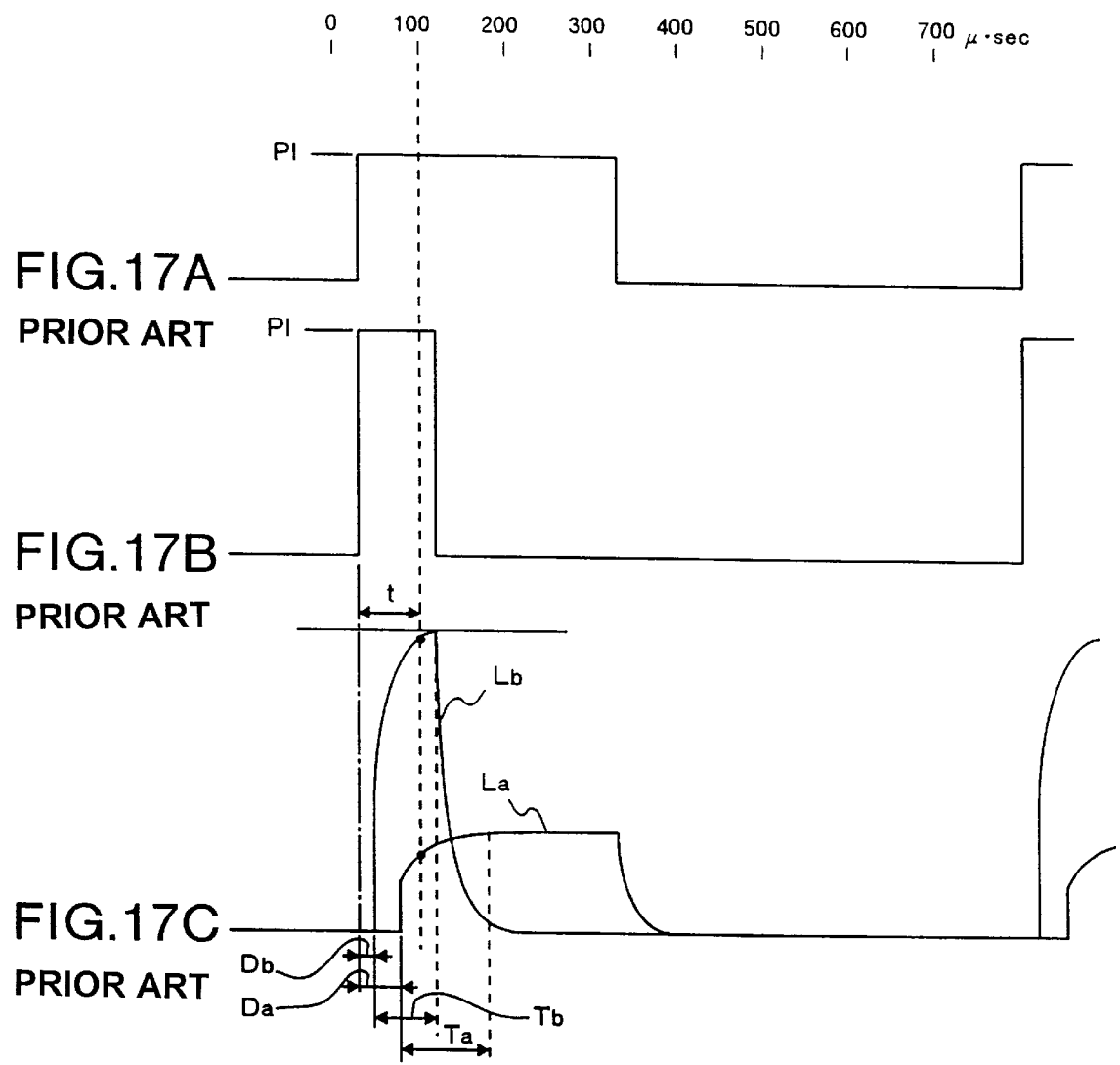

CONTROL METHOD OF EXCITING A PULSE LASER AND POWER SUPPLY UNIT FOR EXCITING A PULSE LASER

FIELD OF THE INVENTION

The present invention relates to a control method of exciting a pulse laser and a power supply unit for exciting a pulse laser, and more particularly to a control method of exciting a pulse laser as well as to a power supply unit for exciting a pulse laser for a laser unit for exciting a laser medium by, any exciting unit such as electric discharge, a lamp or a laser diode and emitting a laser beam.

BACKGROUND OF THE INVENTION

FIG. 16 shows a laser diode-excited solid laser unit based on a conventional type of power supply unit for laser excitation. A power supply unit 100 for laser excitation outputs a current having a current value set by a current setting device 102 to a laser diode 106 as an exciting unit in synchronism with a reference pulse signal (laser power output signal) outputted from a reference oscillator 104.

The laser diode 106 outputs excitation light by energization and excites a solid laser medium 108 comprising a YAG rod or the like, and the solid laser medium 108 outputs a laser in a pulse form from an optical resonator 116 comprising a total reflection mirror 112 provided in the rear side thereof and a half reflection mirror 114 provided in the front side (output side) thereof.

FIG. 17A to FIG. 17C show a power output waveform and a laser output waveform according to the conventional type of power supply unit shown in FIG. 16. FIG. 17A shows a power output waveform when a current set value PI by the current setting device 102 is low, and FIG. 17B shows a power output waveform when the current set value PI by the current setting device 102 is high respectively, while a reference sign La in FIG. 17C shows a laser output waveform when the current set value PI is low, and a reference sign Lb therein shows a laser output waveform when the current set value PI is high respectively.

A power output waveform in the conventional type of power supply unit for laser excitation is, as shown in FIGS. 17A and 17B, a simple rectangular waveform regardless of amplitude of current set value PI is constant at one pulse.

As the conventional type of power supply unit for laser excitation outputs a current as a pulse with one simple rectangular waveform (constant current set value at one pulse), if the current set value PI is low, laser output becomes as indicated by the reference sign La in FIG. 17C, which shows that the delay Da in rising of the laser output to power output (laser output signal) is larger, so that 50 to 70 μs is required for laser output.

This delay becomes smaller, by making a current set value higher, according to the set value, but even if the value is set to a quite high current value (twice to three times), the delay Db can not be reduced to not more than 20 to 30 μs in the laser output as indicated by the reference sign Lb in FIG. 17C.

Regardless of the current set value, rise times Ta, Tb required for laser output to reach its stable state increase, as shown in FIG. 17C, with a first order lag therebetween and a time of 100 to 200 μs has to be required.

When pulse laser output is used for laser machining, and if a pulse frequency is specified to be 1 kHz and a duty to be 10% as typical machining conditions, a pulse width is 100 μs, which corresponds to a time t in FIG. 17C. Under the machining conditions, when the current set value PI is low, the laser output La can hardly be effected, and even when the current set value PI is high, the laser output Lb in its stable state can not be effected, in which the output waveform is a waveform like a chopping wave. For this reason, if the pulse frequency is set to be high and the duty is set to be low in the conventional type of power supply unit, characteristics in machining such as cutting are degraded.

As described above, the conventional type of power supply unit for laser excitation has had such problems that quick response of laser output can not be made, so that an accurate pulse laser can not be outputted when machining is carried out with short pulses.

SUMMARY OF THE INVENTION

It is an object of the present invention to obtain, for the purpose of solving the problems described above, a control method of exciting a pulse laser and a power supply unit for exciting a pulse laser in which there is no delay in rising of a laser output to a laser power output signal, the laser output rapidly reaches its stationary output, and responsiveness of pulse output is improved.

With the control method of exciting a pulse laser according to the present invention, there are steps of exciting an exciting unit with a first excitation amplitude immediately before a laser output signal is turned ON and until the laser output signal is turned ON, exciting the exciting unit with a second excitation amplitude from a point of time immediately after the laser output signal is turned ON until a specified point of time before the laser output signal is turned OFF, and exciting the exciting unit with a third excitation amplitude from a point of time when energization according to the second excitation amplitude is ended until the laser output signal is turned OFF, so that a delay in a rising portion of laser output can be zero or extremely short period, the laser output can rapidly reach its stationary output, and responsiveness of pulse output is improved, and for this reason machining at a high frequency and a low duty which used to be incapable of performance in the conventional type of power unit can be effected.

With the power supply unit for exciting a pulse laser according to the present invention, a first power unit operates between a point in time when a reference pulse signal changes state, until receipt of a first time delay signal having a time delay with respect to the reference pulse signal, a second power unit operates from receipt of the first time delay signal until receipt of a second time delay signal having a time delay with respect to the first time delay signal, and a third power unit operates from receipt of the second time delay signal until falling of the first time delay signal, and output by synthesizing output from the first power unit, second power unit and the third power unit is supplied to an exciting unit, so that a delay in a rising portion of laser output can be zero or an extremely short period, the laser output can rapidly reach its stationary output, and responsiveness of pulse output is improved, and for this reason machining at a high frequency and a low duty which used to be incapable of performance in the conventional type of power unit can be effected.

Other objects and features of this invention will become understood from the following description with reference to the accompanying drawings.

BRIEF DESCRIPTION OF THE DRAWINGS

FIGS. 17A to 17C are timing charts showing operations of the power supply unit for exciting a pulse laser based on the conventional technology.

DESCRIPTION OF THE PREFERRED EMBODIMENTS

Figure 1:
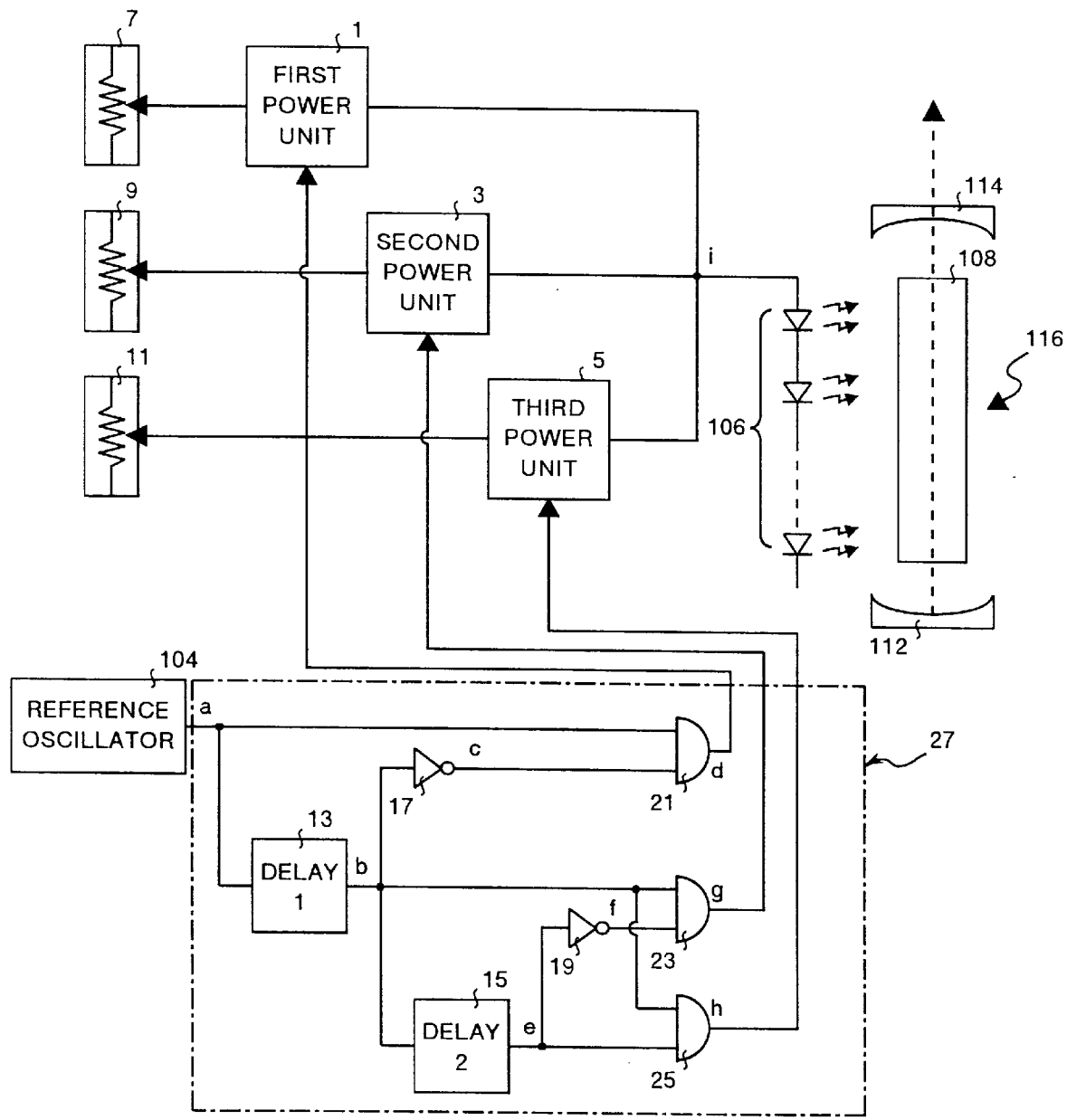
FIG. 1 is a block diagram showing Embodiment 1 of a power supply unit for exciting a pulse laser according to the present invention.

Detailed description is made hereinafter for preferred embodiments of a control method of exciting a pulse laser and a power supply unit for exciting a pulse laser according to the present invention with reference to the related drawings. It should be noted that the same reference numerals in the embodiments of the present invention described later are assigned to the sections corresponding to those based on the conventional technology, and description thereof is omitted herein.

FIG. 1 shows Embodiment 1 of the power supply unit for laser excitation according to the present invention. This power supply unit for laser excitation according to the present invention comprises a first power unit 1, a second power unit 3, and a third power unit 5, and supplies a current (i) obtained by synthesizing currents outputted from each of the power units 1, 3, and 5 in parallel to a laser diode 106.

Discretely connected to The first power unit 1, second power unit 3 and third power unit 5 are current setting devices 7, 9 and 11 respectively, and the first power unit 1, second power unit 3 and third power unit 5 have peak current values discretely set by the current setting devices 7, 9, and 11, respectively.

The first power unit 1 has a peak current value set by the current setting device 7 and outputs a first excitation amplitude $I_1$, the second power unit 3 has a peak current value set by the current setting device 9 and outputs a second excitation amplitude $I_2$, and the third power unit 5 has a peak current value set by the current setting device 11 and outputs a third excitation amplitude $I_3$.

A reference oscillator 104 is equivalent to that based on the conventional technology, and a specified frequency outputted from the reference oscillator 104 and a reference pulse signal for a specified duty are inputted into a logical circuit 27 comprising a first delay element 13, a second delay element 15, inverter elements 17, 19, and first to third AND gate elements 21, 23 and 25, and are given from the logical circuit 27 to each of the power units 1, 3, and 5.

The first AND gate element 21 is used for outputting a power output signal for the first power unit 1, and outputs a logical product signal d between an output signal (reference pulse signal) a from the reference oscillator 104 and an inverted signal c of a first time delay signal b after passing through the first delay element 13 to the first power unit 1 as a power output signal. The first time delay signal b is a signal having a time delay decided by the first delay element 13 to the reference pulse signal a.

The second AND gate element 23 is used for outputting a power output signal for the second power unit 3, and outputs a logical product signal g between the first time delay signal b after passing through the first delay element 13 and an inverted signal f of a second time delay signal e obtained after passing through the second delay element 15 to the second power unit 3 as a power output signal. The second time delay signal e is a signal further having a time delay decided by the second delay element 15 to the first time delay signal b.

The third AND gate element 25 is used for outputting a power output signal for the second power unit 5, and outputs a logical product signal h between the first time delay signal b after passing through the first delay element 13 and the second time delay signal e after passing through the second delay element 15 to the third power unit 5 as a power output signal.

Figure 2:
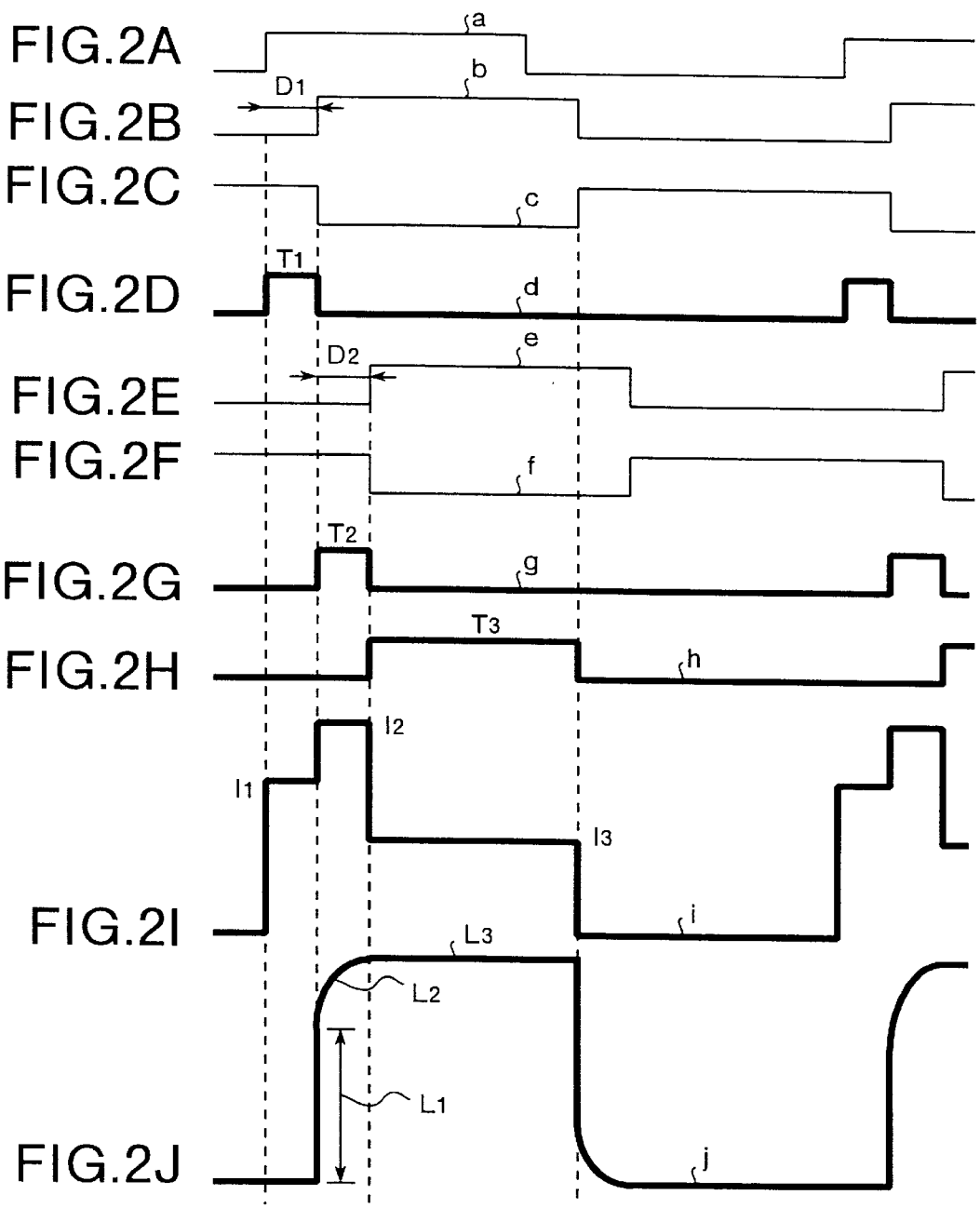
FIGS. 2A to 2J are timing charts showing operations of the power supply unit for exciting a pulse laser according to Embodiment 1.

Next operations of the power supply unit for laser excitation having the above-described structure are described with reference to the timing charts shown in FIGS. 2A to 2J. FIG. 2A shows an output signal a from the reference oscillator 104, FIG. 2B the first time delay signal b after passing through the first delay element 13, FIG. 2C the inverted signal c of the first time delay signal b, FIG. 2D the power output signal d for the first power unit 1, FIG. 2E the second time delay signal e after passing through the second delay element 15, FIG. 2F the inverted signal f of the second time delay signal e, FIG. 2G the power output signal g for the second power unit 3, FIG. 2H the power output signal h for the third power unit 5, FIG. 2I a synthesized current i given from the first to third power units 1, 3 and 5 to the laser diode 106, and FIG. 2J a laser output waveform respectively.

The power output signal d for the first power unit 1 is a signal kept at a high level for a period from rising of the output signal a from the reference oscillator 104 until rising of the first time delay signal b, and an operating time $T_1$ of the first power unit 1 according to this signal is decided depending on a delay time $D_1$ by the first delay element 13.

The power output signal g for the second power unit 3 is a signal kept at a high level for a period from rising of the time delay signal b until rising of the second time delay signal e, and an operating time $T_2$ of the second power unit 3 according to this signal is decided depending on a delay time $D_2$ by the second delay element 15.

The power output signal h for the third power unit 5 is a signal kept at a high level for a period from rising of the second time delay signal e until falling of the time delay signal b, and an operating time $T_3$ of the third power unit 5 according to this signal is decided depending on the ON-time of the power output signal d and delay times $D_1$, $D_2$ of the first delay element 13 and second delay element 15.

When excitation amplitudes (current value) set in the current setting devices 7, 9 and 11 for the first to third power units 1, 3 and 5 respectively are synthesized, the amplitude is made to a current i to be supplied to the laser diode 106, and when the first time delay signal b is set as a reference for pulse signals, namely if the first time delay signal b is handled as a laser output signal, a delay in rising of a laser output can be made zero by adjusting the operating time $T_1$ of the first power unit 1 and the first excitation amplitude $I_1$, namely excitation energy for the first power unit 1. As an operation for the adjustment, there is a tendency that a delay is reduced by making higher the first excitation amplitude $I_1$.

A first steep rise $L_1$ in laser output tends to become higher as the first excitation amplitude $I_1$ becomes higher. Accordingly, in order to increase the first steep rise $L_1$ of the laser, the first excitation amplitude $I_1$ is set to be higher and the operating time $T_1$ of the first power unit 1 is set to be shorter according to the amplitude, and with those operations, a rise $L_1$ with high laser output can be obtained together with a rise of the first time delay signal b.

The first excitation amplitude $I_1$ and the operating time $T_1$ (delay time $D_1$) are contradictory to each other, in which the delay time $D_1$ is shorter in accordance with increase of the first excitation amplitude $I_1$. The first steep rise $L_1$ is substantially proportional to increase of the first excitation amplitude $I_1$, and an output, although depending on a structure of the laser oscillator, by around 1/3 of the steady value of the laser output with the first excitation amplitude $I_1$ can be obtained.

After the first steep rise of the laser, a smooth rise $L_2$ of the laser is effected by excitation with the second excitation amplitude $I_2$ by the second power unit 3, and by switching the excitation amplitude $I_2$ to the third excitation amplitude $I_3$ at the point of time when the laser output with the third excitation amplitude 3 reaches a steady output value $L_3$, in other words, by excitation with the third excitation amplitude $I_3$ by the third power unit 5, a laser output with a waveform as shown in FIG. 2J can be obtained. Namely, the laser output can most quickly reach the steady output value $L_3$ with the third excitation amplitude $I_3$, and can make a waveform similar to a rectangular output. The smooth rise $L_2$ of the laser output can be made quicker by making the second excitation amplitude $I_2$ higher.

Figure 3:
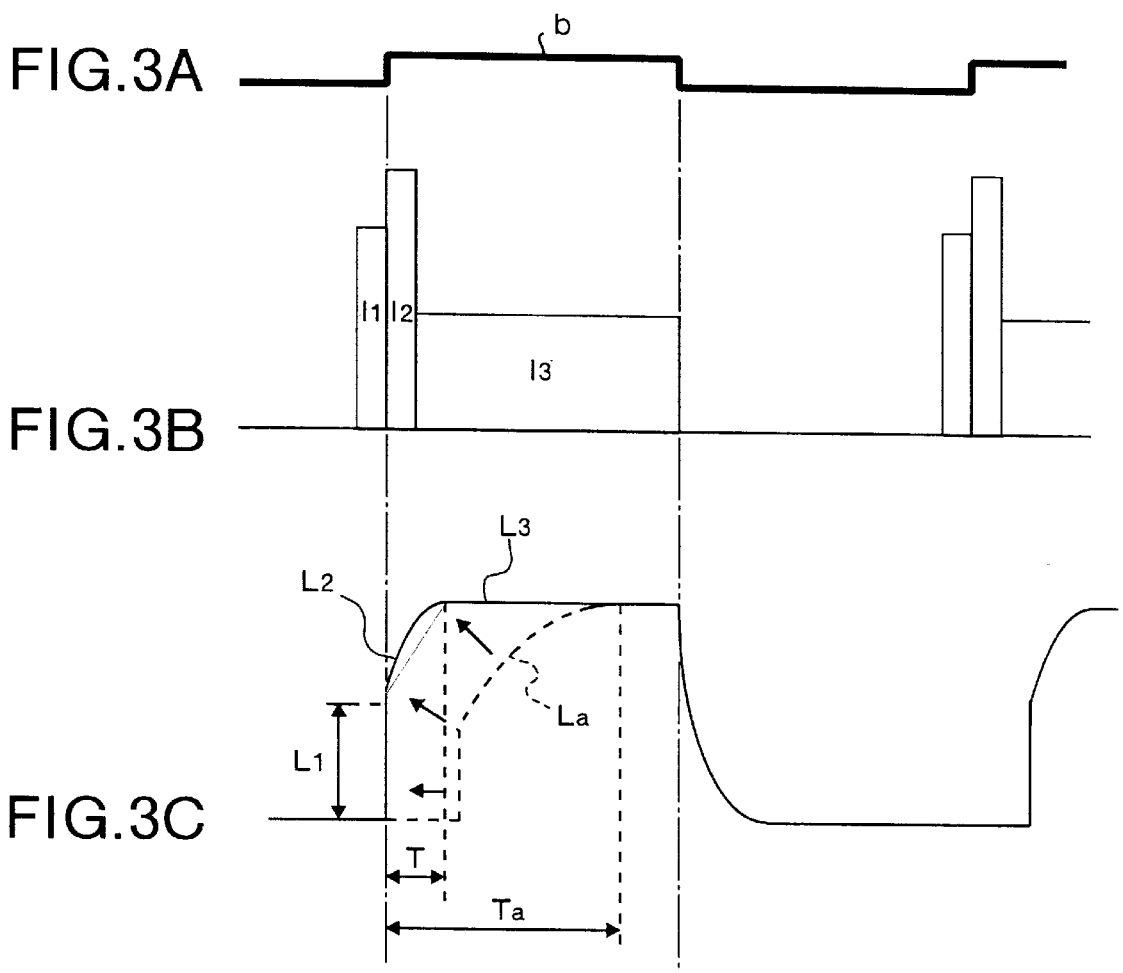
FIGS. 3A to 3C are timing charts showing control characteristics in the power supply unit for exciting a pulse laser according to Embodiment 1.

Then, evaluation is made for laser output with reference to FIG. 3A to FIG. 3C. FIG. 3A shows the first time delay signal b after passing through the first delay element 13, FIG. 3B a synthesized current i given from the first to third power units 1, 3 and 5 to the laser diode 106, and FIG. 3C a laser output waveform respectively.

Although laser output in the conventional type of power supply unit for laser excitation is an output waveform as indicated by the broken line in FIG. 3C, the laser output according to the power supply unit for laser excitation according to the present invention is improved to the output waveform as indicated by the solid line in FIG. 3C. Especially, when each of the first excitation amplitude $I_1$ and the second excitation amplitude $I_2$ is set twice or three times as high as the third excitation amplitude $I_3$, the first steep rise $L_1$ is higher and a rise speed in the smooth rise $L_2$ of the laser output is quicker, namely a time T required for reaching the steady output value can be dramatically reduced as compared to that Ta based on the conventional technology, and for this reason, laser output is not reduced even when machining is carried out at a high frequency and a low duty at the time of laser machining, and a laser output waveform with high machining capability can be obtained.

Figure 4:
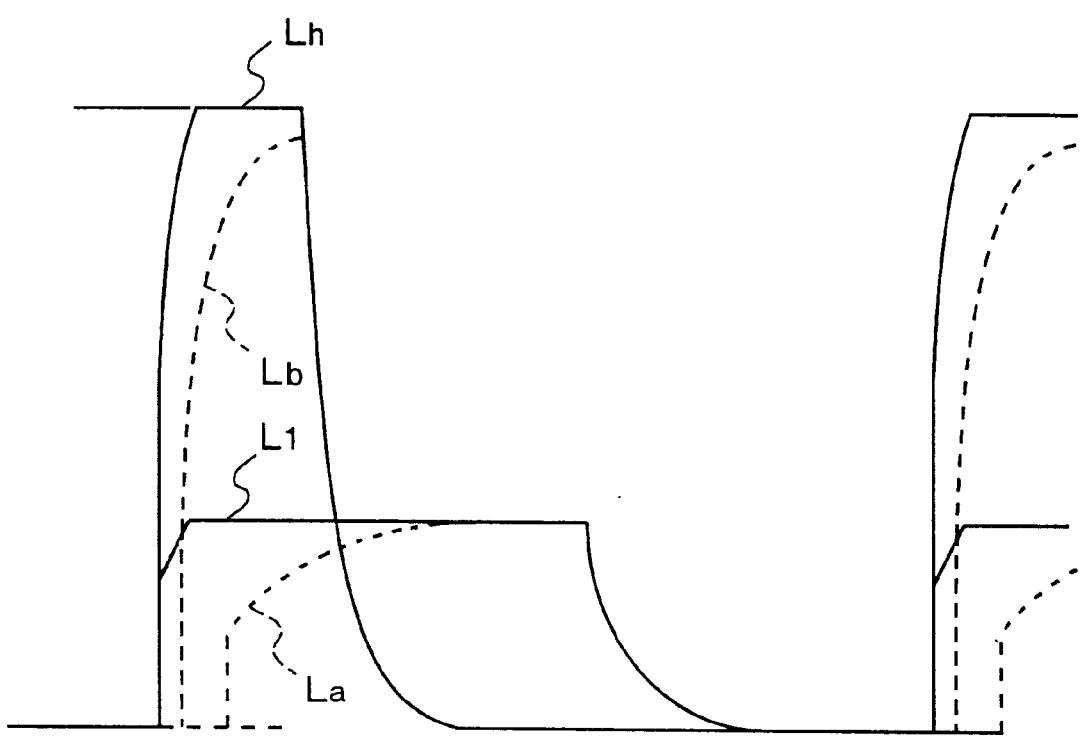
FIG. 4 is a timing chart showing another control characteristics in the power supply unit for exciting a pulse laser according to Embodiment 1.

FIG. 4 shows a comparison between a laser output waveform from the power supply unit for laser excitation according to the present invention and a laser output waveform from the power supply unit for laser excitation based on the conventional technology. An output waveform when the third excitation amplitude $I_3$ is low is improved from the La to $L_1$, and an output waveform when the third excitation amplitude $I_3$ is high and the duty is low is improved from the Lb to Lh. In either of the waveforms, improvement of the laser output waveform when an output is high and a duty is low is very high even if average power supplied to a laser diode is equivalent to each other.

Figure 5:
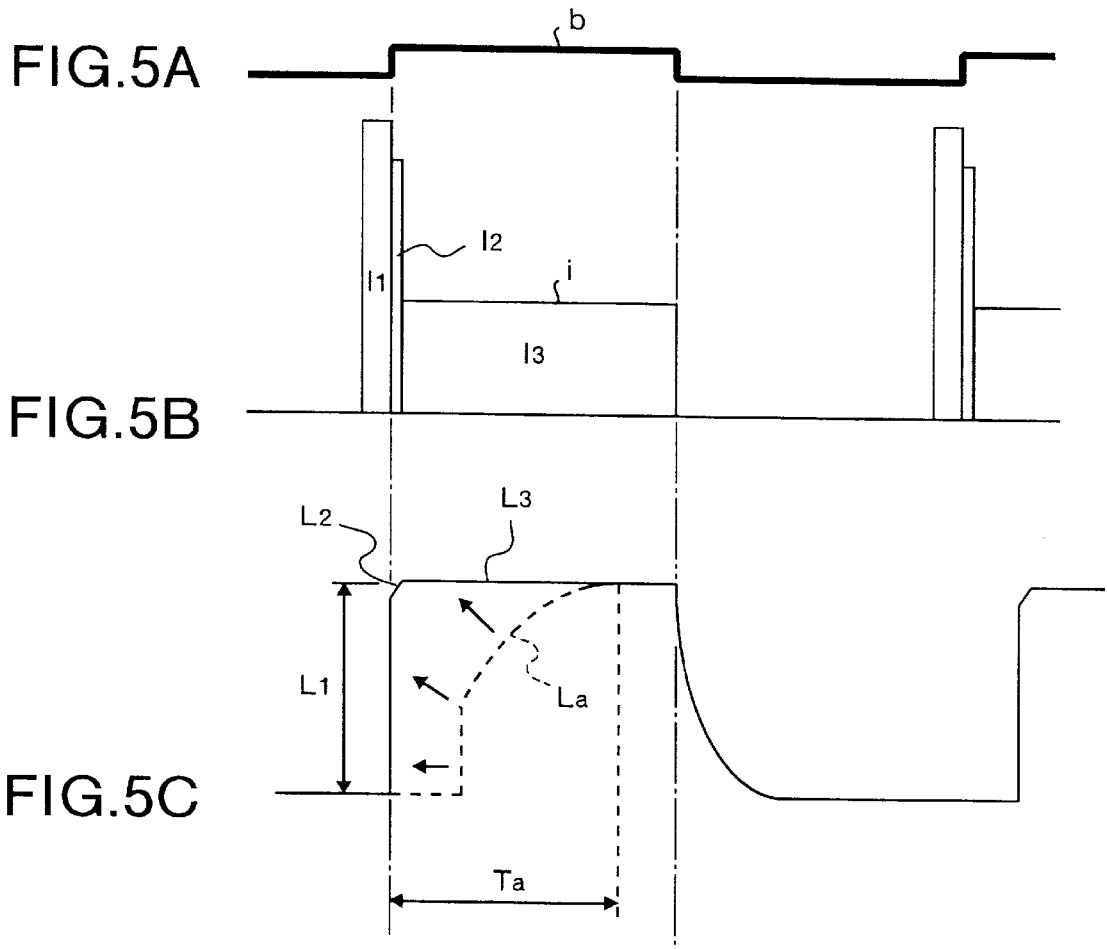
FIGS. 5A to 5C are timing charts showing another control characteristics in the power supply unit for exciting a pulse laser according to Embodiment 1.

FIG. 5A to FIG. 5C show control characteristics in a case where the improvement is further applied to the rising waveform of a laser output. Like FIGS. 3A to 3C, FIG. 5A shows the first time delay signal b after passing through the first delay element 13, FIG. 5B a synthesized current i given from the first to third power units 1, 3 and 5 to the laser diode 106, and FIG. 5C a laser output waveform respectively.

The first excitation amplitude $I_1$ is set (around three times as high as the third excitation amplitude $I_3$) in the control characteristics shown in FIGS. 5A to 5C so that the first rise $L_3$ is substantially equivalent to the steady output value $L_3$ with the excitation amplitude $I_3$, and for this reason the rise can have a substantially complete rectangular shape and laser output with high machining capability can be supplied even under the conditions of a low duty at a high frequency. In this case the second excitation amplitude $I_2$ is zero or is effected for an extremely short period.

Figure 6:
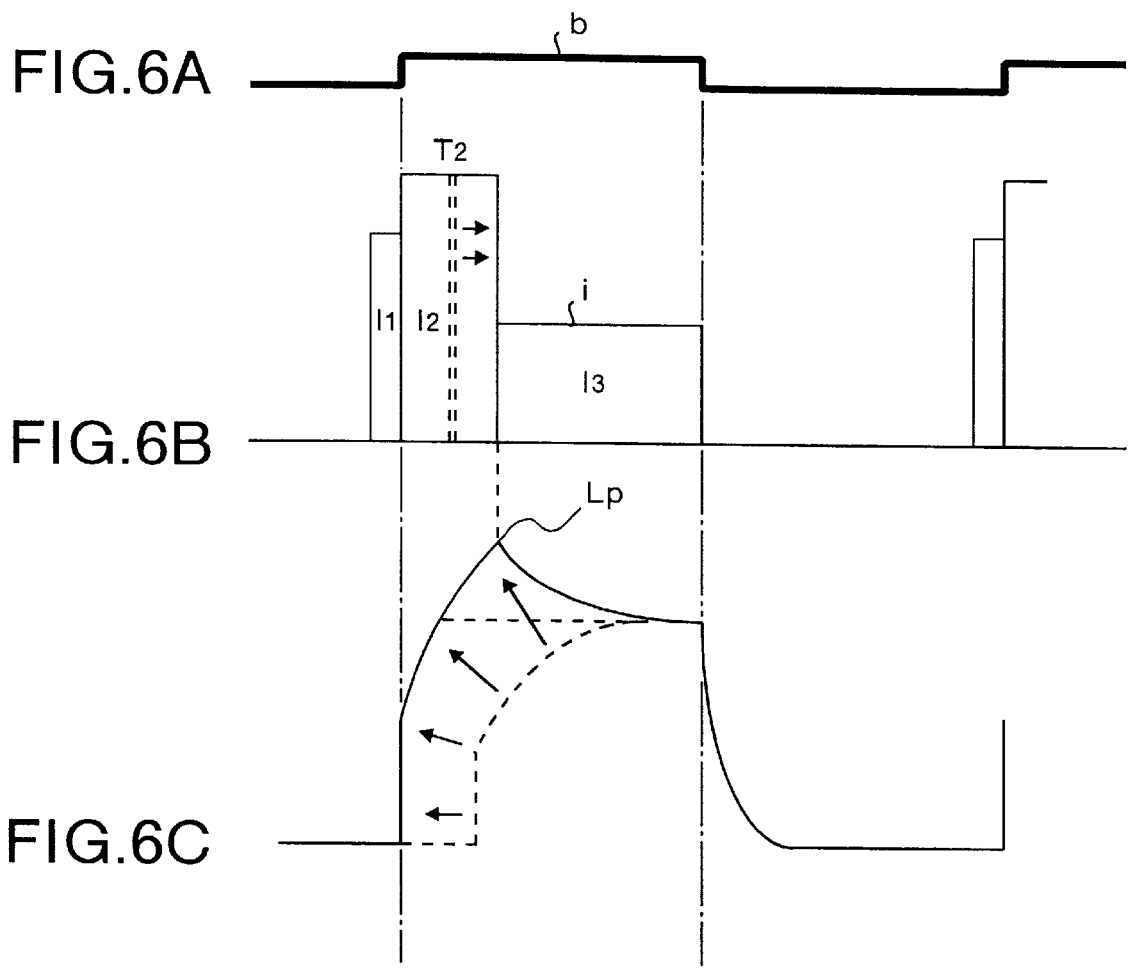
FIGS. 6A to 6C are timing charts showing another control characteristics in the power supply unit for exciting a pulse laser according to Embodiment 1.

FIGS. 6A to 6C show control characteristics in a case where improvement is applied to the rising waveform of a laser output waveform. The second excitation amplitude $I_2$ is set to be higher and an energized time $T_2$ with the second excitation amplitude $I_2$ is set to be slightly longer in the control characteristics shown in FIGS. 6A to 6C so that higher output Lp than the steady output value $L_3$ with the third excitation amplitude $I_3$ can be outputted, and for this reason a peak value at the time of rising of a waveform can be set higher. The laser output in this waveform is effective to laser machining for a high reflecting material, and a laser output waveform with high machining capability can be provided.

Figure 7:
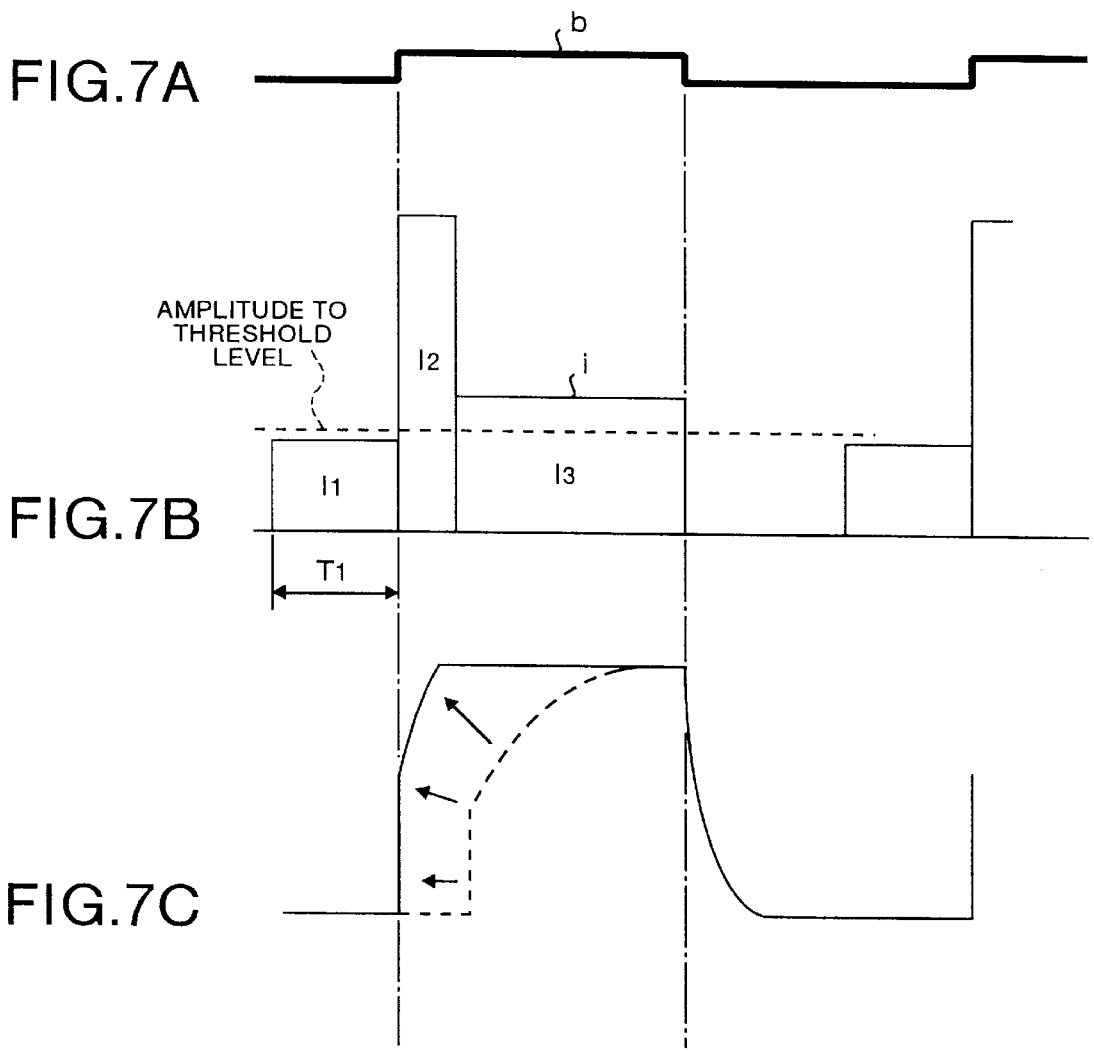
FIGS. 7A to 7C are timing charts showing another control characteristics in the power supply unit for exciting a pulse laser according to Embodiment 1.

FIGS. 7A to 7C show control characteristics in other case. The first excitation amplitude $I_1$ in this example is set to be slightly lower than a threshold (an excitation amplitude at which laser oscillation is started) amplitude. In this case, as laser output is not effected for a period of the energized time $T_1$ with the first excitation amplitude $I_1$, there is no time limit, so that, if there is around 200 μs or more for a steady time required for exciting the amplitude to a threshold level, laser output can rise at almost the same time when the second excitation amplitude $I_2$ rise without particular controls therefor. This control is effected by a small number of control elements, so that a circuit is simpler and is realized at low cost.

Figure 8:
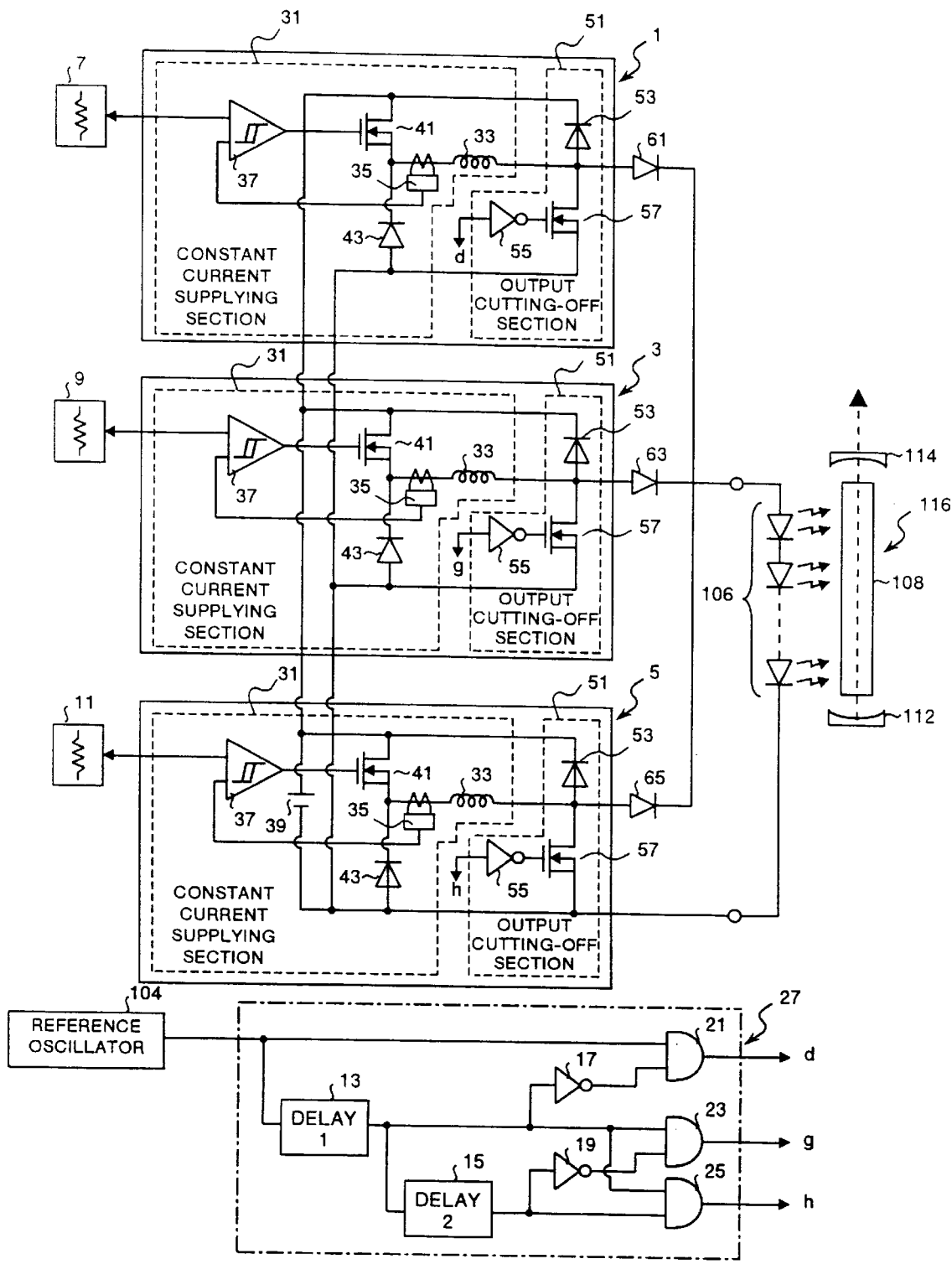
FIG. 8 is a circuit diagram showing Embodiment 2 of the power supply unit for exciting a pulse laser according to the present invention.

FIG. 8 shows Embodiment 2 of the power supply unit for exciting a pulse laser according to the present invention. It should be noted that, in FIG. 8, the same reference numerals are assigned to the sections corresponding to those in FIG. 1, and description thereof is omitted herein.

Each of the first to third power units 1, 3, and 5 comprises a constant current supplying section 31 and an output cutting-off section 51 connected to the output of the constant current supplying section 31 respectively.

The constant current supplying section 31 comprises a reactor 33, a comparator 37 for comparing a current value set by each of the current setting devices 7, 9 or 11 to a reactor current value detected by a current detector 35, a switching element 41 for supplying a constant current connected to a positive electrode of a DC current power unit 39 for switching a current ON or OFF by an output signal from the comparator 37, and a diode 43 serially connected to the switching element 41, in which controls are provided so that a current at the reactor 33 connected to a contact point between the switching element 41 and the diode 43 is a current value set by any of the current setting devices 7, 9 and 11.

The output cutting-off section 51 comprises a diode 53 connected to the positive electrode of the DC current power unit 39, and a switching element 57 for controlling cut-off of output serially connected to the diode 53 for switching the output ON or OFF with any of the logical product signals d, g or h given thereto by any of the first AND gate element 21, second AND gate element 23 or third AND gate element 25 in the logical circuit 27 through an inverter 55, in which energization to the laser diode 106 is controlled by being ON/OFF of the switching element 57.

In this embodiment, by giving any of the logical product signals d, g and h similar to those in Embodiment 1 to the output cutting-off section 51 in any of the first to third power units 1, 3, and 5, each current with the first excitation amplitude $I_1$, second excitation amplitude $I_2$, and third excitation amplitude $I_3$ can also successively be generated similarly to the case in Embodiment 1, and a current obtained by synthesizing the generated currents through diode 61, 63 and 65 can be supplied to the laser diode 106.

Accordingly, the same effect as that in the case of Embodiment 1 can be obtained in this embodiment as well.

Figure 9:
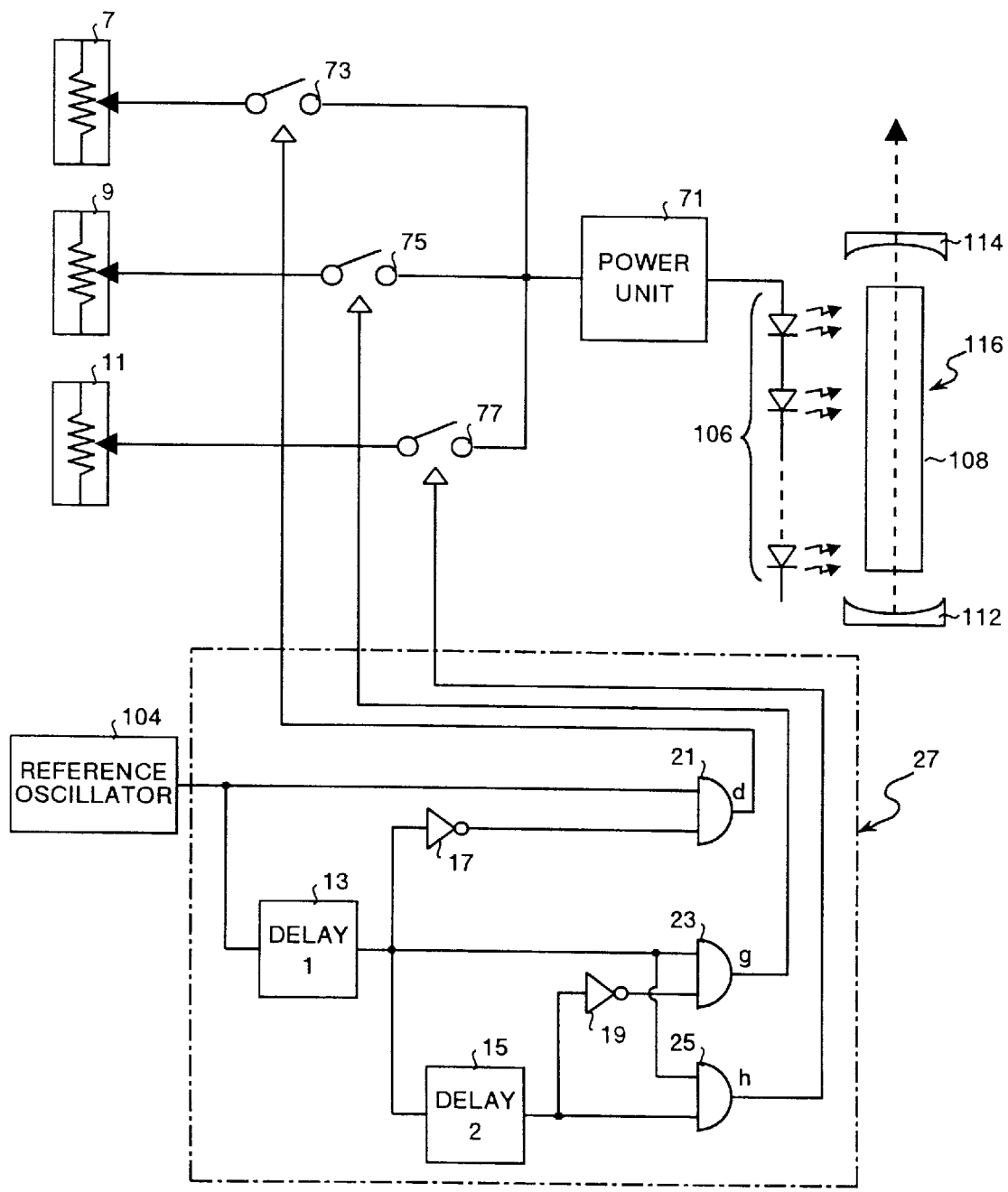
FIG. 9 is a block diagram showing Embodiment 3 of the power supply unit for exciting a pulse laser according to the present invention.

FIG. 9 shows Embodiment 3 of the power supply unit for exciting a pulse laser according to the present invention. It should be noted that, in FIG. 9, the same reference numerals are assigned to the sections corresponding to those in FIG. 1, and description thereof is omitted herein.

A piece of quick-response type power unit 71 is provided in this embodiment, and current setting devices each connected thereto are switched by switches 73, 75, and 77 respectively.

The power unit 71 outputs a current with a current value (first excitation amplitude $I_1$) set by the current setting device (first current setting device) 7 according to closing of the switch 73, outputs a current with a current value (second excitation amplitude $I_2$) set by the current setting device (second current setting device) 9 according to closing of the switch 75, and outputs a current with a current value (third excitation amplitude $I_3$) set by the current setting device (third current setting device) 11 according to closing of the switch 77.

In this embodiment, by closing any of the switches 73, 75, and 77 with any of the logical product signals d, g and h similar to those in Embodiment 1, each current with the first excitation amplitude $I_1$, second excitation amplitude $I_2$, and third excitation amplitude $I_3$ can also successively be generated similarly to the case in Embodiment 1, and the generated current can be supplied to the laser diode 106.

Accordingly, the same effect as that in the case of Embodiment 1 can be obtained in this embodiment as well, and in addition, a number of power unit may be one piece, which makes the circuit simpler and its cost low.

Figure 10:
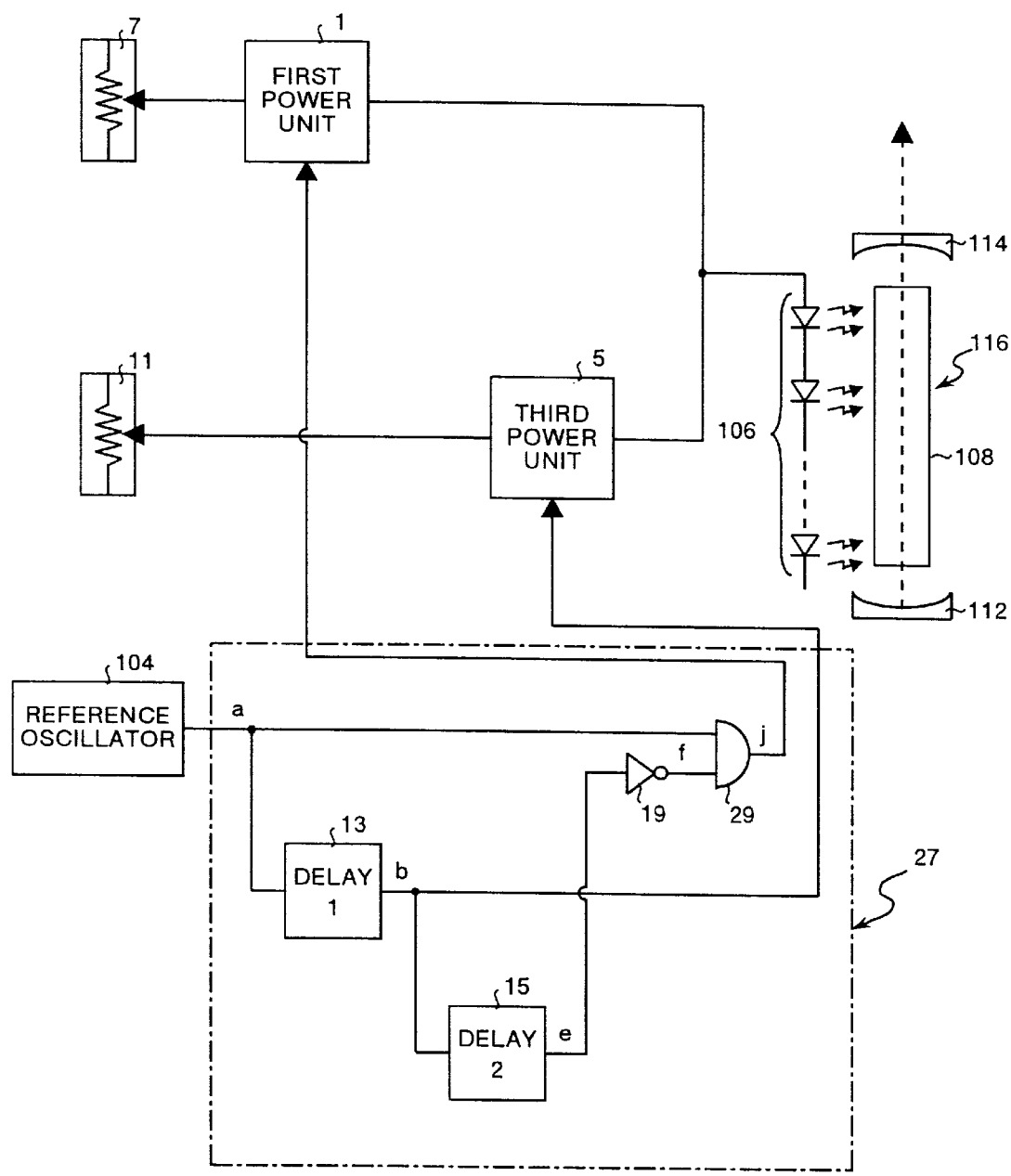
FIG. 10 is a block diagram showing Embodiment 4 of the power supply unit for exciting a pulse laser according to the present invention.

FIG. 10 shows Embodiment 4 of the power supply unit for exciting a pulse laser according to the present invention. It should be noted that, in FIG. 10, the same reference numerals are also assigned to the sections corresponding to those in FIG. 1, and description thereof is omitted herein.

In this embodiment, two power units corresponding to the first power unit 1 and the third power unit 5 in Embodiment 1 are provided, and supplying of a current with the second excitation amplitude $I_2$ over the time of $T_2$ by the second power unit 3 in Embodiment 1 is substituted by obtaining the second excitation amplitude $I_2$ with the first excitation amplitude $I_1$ as well as with the third excitation amplitude $I_3$ by a duplex operation of the first power unit 1 and the third power unit 5.

A logical circuit 27 comprises, in order to enable the operations as described above, a first delay element 13, a second delay element 15, an inverter element 19, and an AND gate element 29, outputs a logical product signal j by the AND gate element 29 between an output signal a from the reference oscillator 104 and an inverted signal f of a second time delay signal e after passing through the second delay element 15 to the first power unit 1 as a power output signal, and outputs a first time delay signal b after passing through the first delay element 13 to the third power unit 5 as a power output signal.

Figure 11:
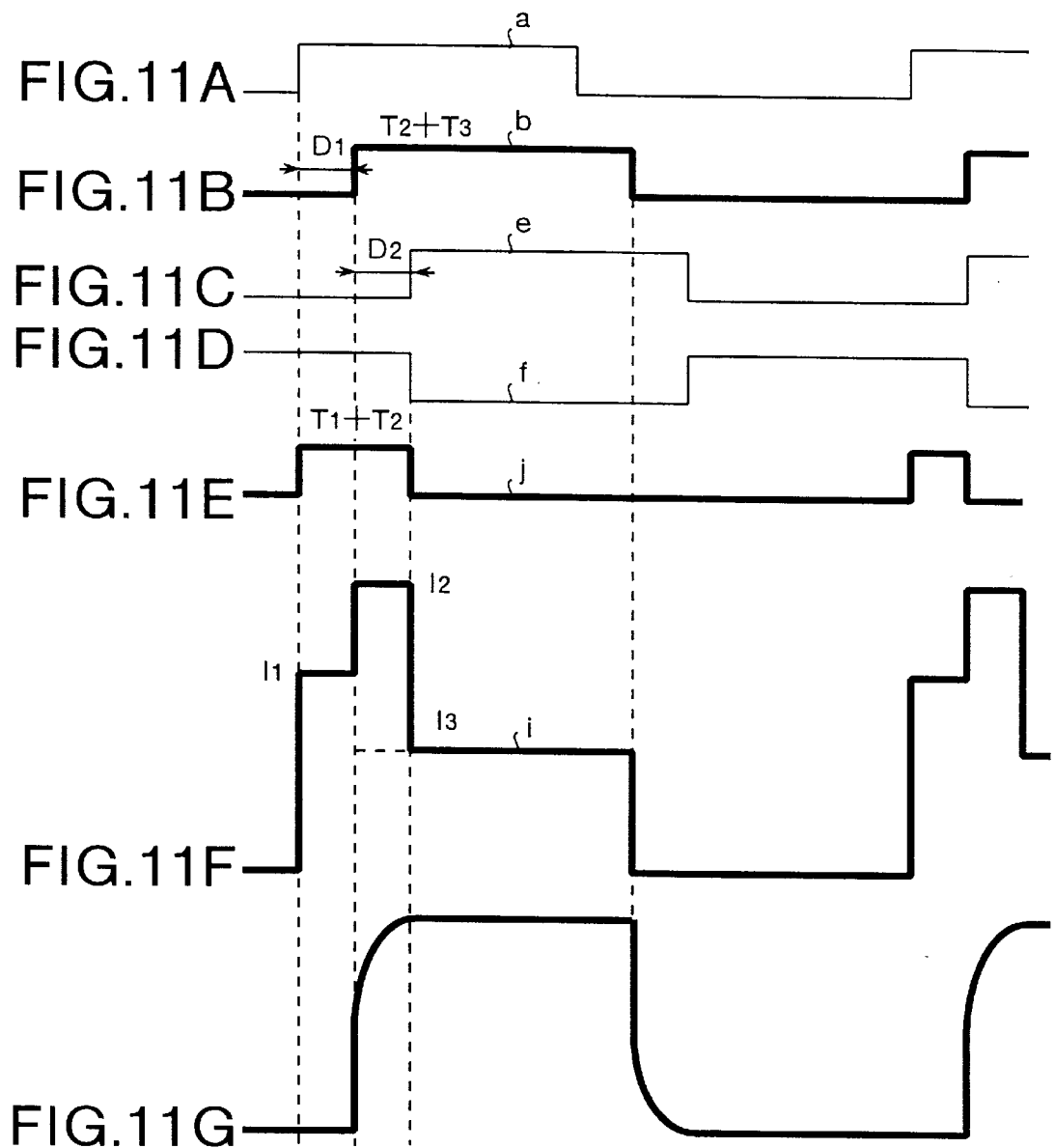
FIGS. 11A to 11G are timing charts showing operations of the power supply unit for exciting a pulse laser according to Embodiment 4.

Next description is made for operations of the power supply unit for laser excitation having the structure described above with reference to the timing charts shown in FIG. 11A to FIG. 11J. FIG. 11A shows an output signal a from the reference oscillator 104, FIG. 11B a time delay signal (a power output signal for the third power unit 5) b after passing through the first delay element 13, FIG. 11C a second time delay signal e after passing through the second delay element 15, FIG. 11D an inverted signal f of the second time delay signal e, FIG. 11E a power output signal j for the first power unit 1, FIG. 11F a synthesized current i given from the first and third power units 1 and 5 to the laser diode 106, and FIG. 11G a laser output waveform respectively.

The power output signal j for the first power unit 1 is a signal kept at a high level for a period from rising of the output signal a from the reference oscillator 104 until rising of the second time delay signal e, and an operating time of the first power unit 1 according to this signal is $T_1+T_2$.

The power output signal b for the third power unit 5 is a signal kept at a high level for a period from rising of the first time delay signal b until falling of the first time delay signal b, and an operating time of the third power unit 5 according to this signal is $T_2+T_3$. With this feature, the first power unit 1 and the third power unit 5 are concurrently operated for the operating time $T_2$, and the second excitation amplitude $I_2$ is obtained, similarly to the case in Embodiment 1, as a value between the first excitation amplitude $I_1$ and the third excitation amplitude $I_3$.

Accordingly, the same effect as that in the case of Embodiment 1 can be obtained in this embodiment as well, and in addition, the number of power units may be two pieces, which makes the circuit simpler and its cost low.

Figure 12:
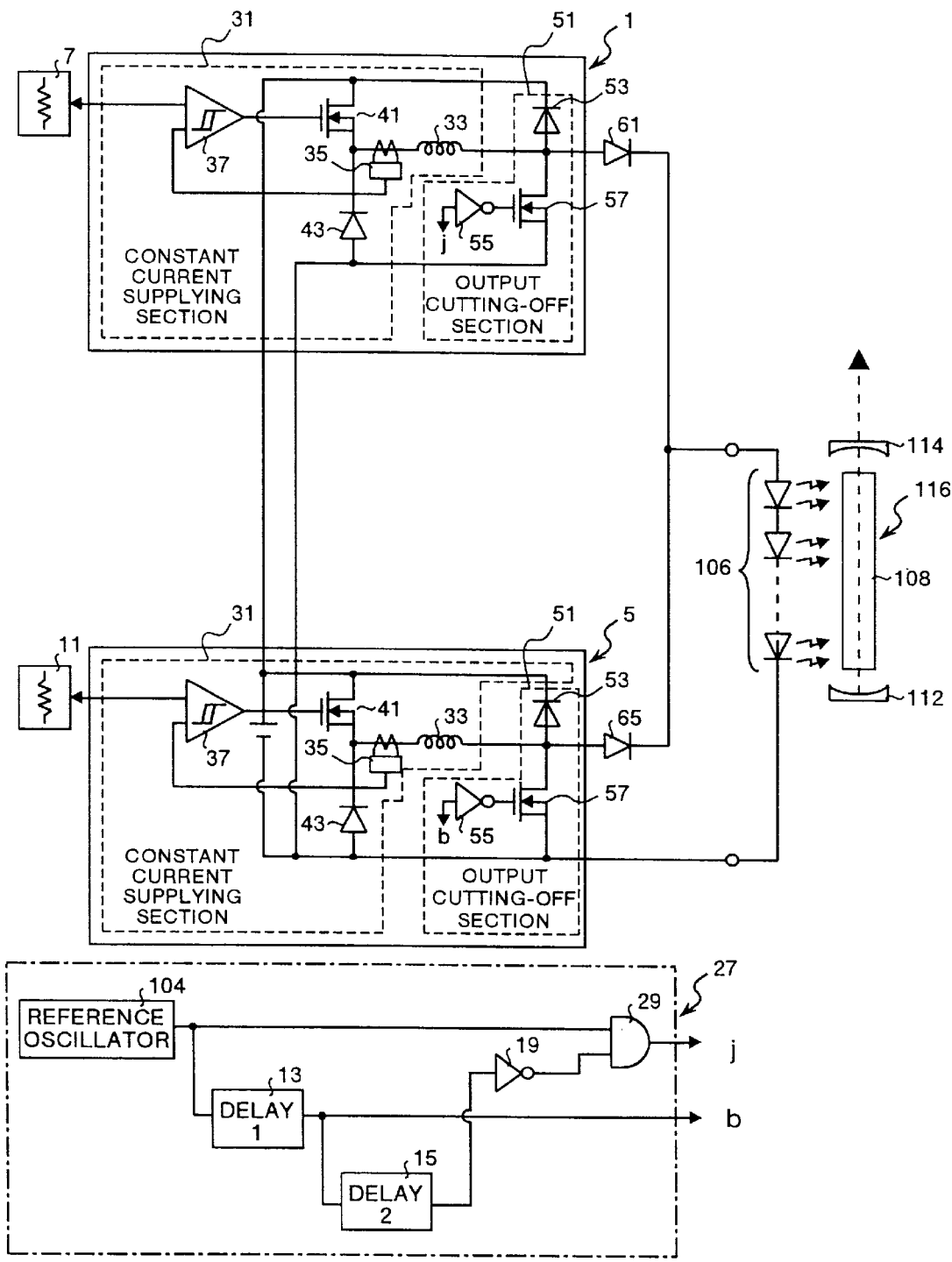
FIG. 12 is a circuit diagram showing Embodiment 4 of the power supply unit for exciting a pulse laser according to the present invention.

FIG. 12 shows a specific circuit structure of the power supply unit for exciting a pulse laser according to Embodiment 4. It should be noted that, in FIG. 12, the same reference numerals are assigned to the sections corresponding to those in FIG. 8 and FIGS. 11A to 11G, and description thereof is omitted herein.

Figure 13:
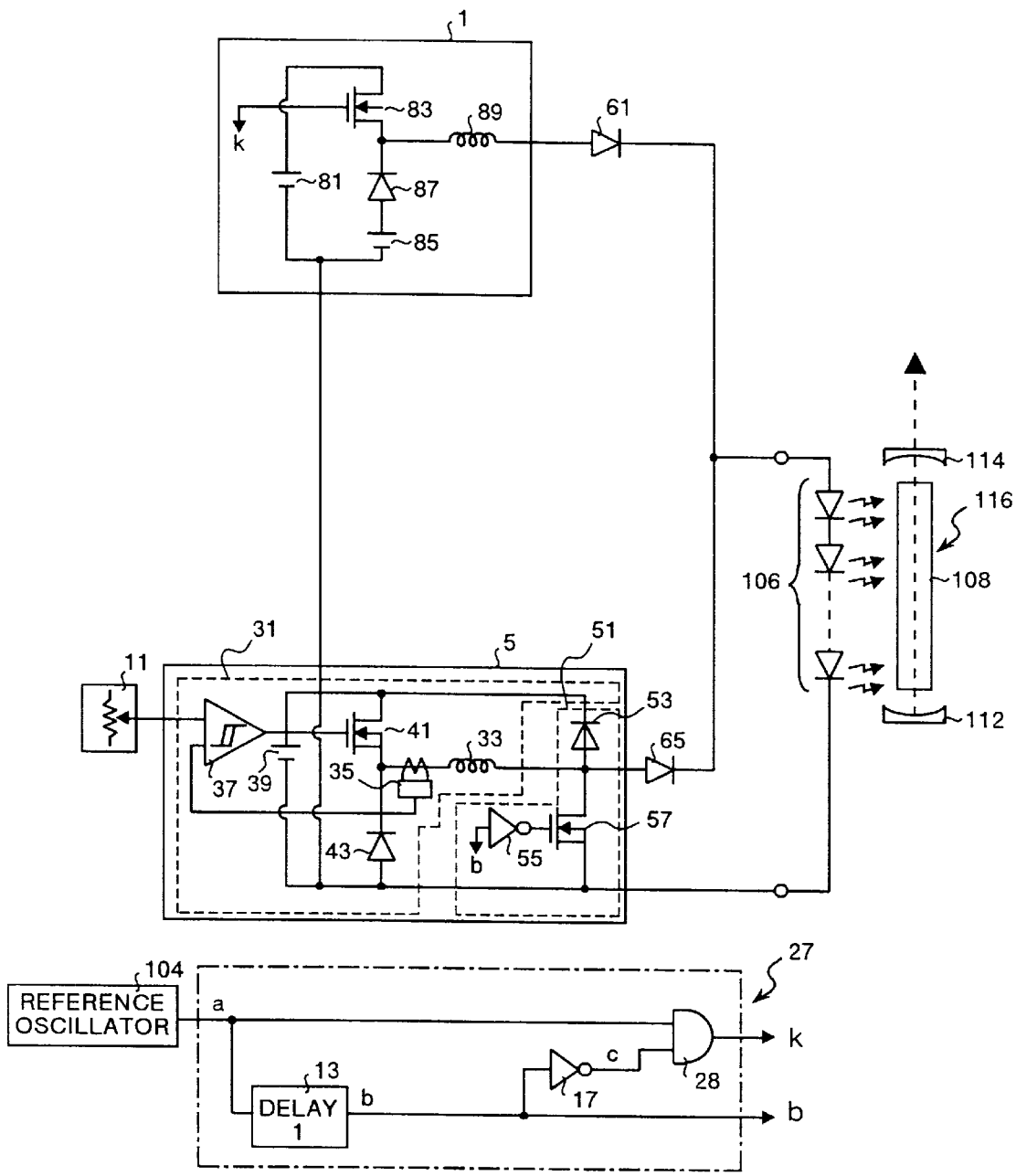
FIG. 13 is a block diagram showing Embodiment 5 of the power supply unit for exciting a pulse laser according to the present invention.

FIG. 13 shows Embodiment 5 of the power supply unit for exciting a pulse laser according to the present invention. It should be noted that, in FIG. 13, the same reference numerals are assigned to the sections corresponding to those in FIG. 12, and description thereof is omitted herein.

In this embodiment, two power units, the first power unit 1 and the third power unit 5, are provided. The first power unit 1 comprises a serial body of a switching element 83 connected to a side of a positive electrode of a DC current power unit 81 and a diode 87 connected to a side of a positive electrode of a DC current power unit 85, and a reactor 89 connected to a contact point between the switching element 83 and the diode 87, and a current at the reactor 89 is supplied to the laser diode 106 according to a voltage at the DC current power unit 81 through the switching element 83 being ON.

The third power unit 5 is equivalent to the unit shown in FIG. 12, and a current at the reactor 89 in the first power unit 1 and a current outputted from a DC current power unit 39 are supplied to the laser diode 106 by turning ON the diode 87 in response to the switching element 83 being off as well as by turning ON the switching element 57.

A logical circuit 27 comprises a first delay element 13, an inverter element 17, and an AND gate element 28, outputs a logical product signal k by the AND gate element 28 between an output signal a from the reference oscillator 104 and an inverted signal c of a first time delay signal b after passing through the first delay element 13 to the first power unit 1 as a power output signal, and outputs the first time delay signal b after passing through the first delay element 13 to the third power unit 5 as a power output signal.

Figure 14:
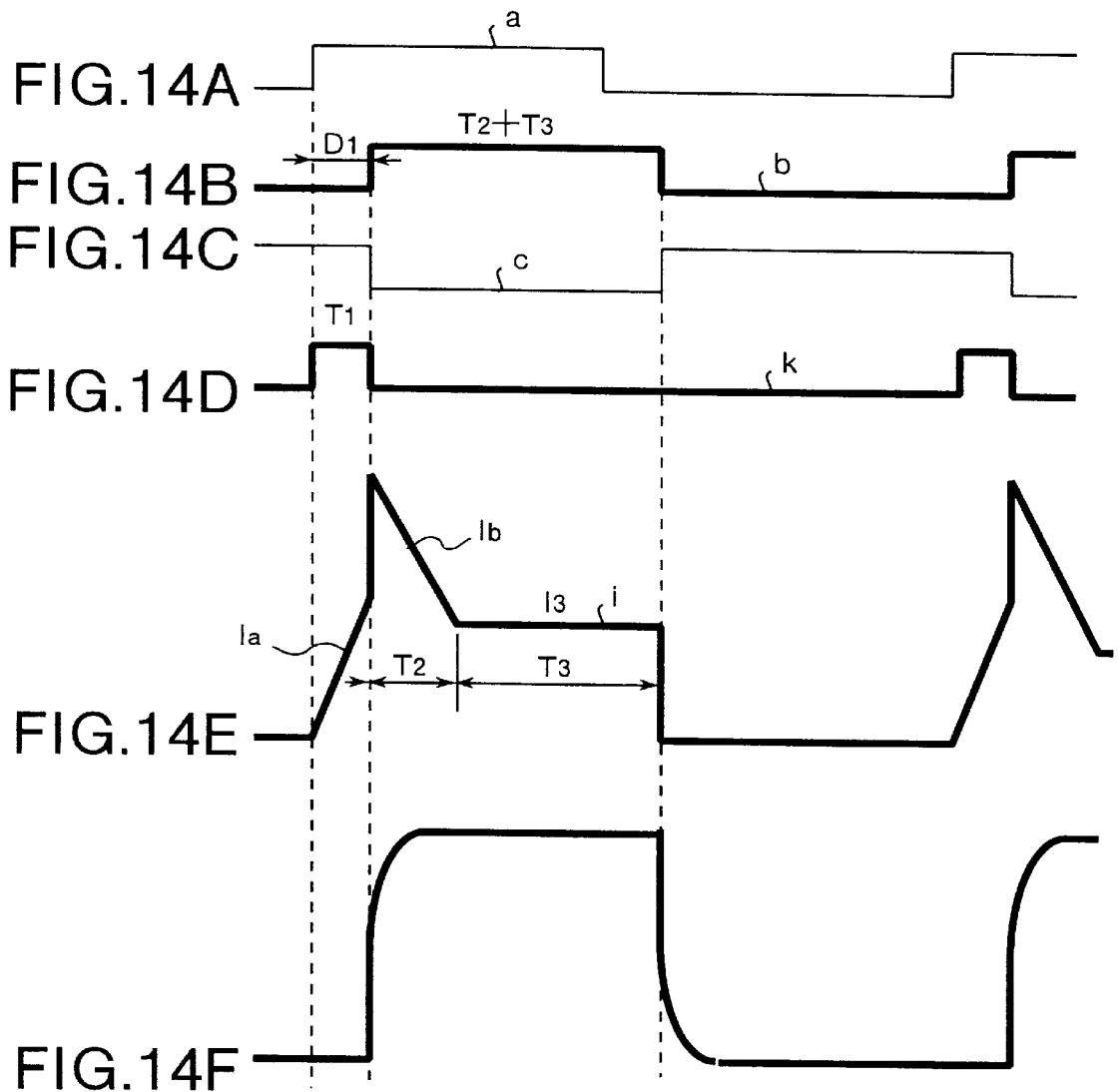
FIGS. 14A to 14F are timing charts showing operations of the power supply unit for exciting a pulse laser according to Embodiment 5.

Next operations of the power supply unit for laser excitation having the structure described above are described with reference to the timing charts shown in FIGS. 14A to 14F. FIG. 14A shows an output signal a from the reference oscillator 104, FIG. 14B a tire delay signal (a power output signal for the third power unit 5) b after passing through the first delay element 13, FIG. 14C an inverted signal c of the first time delay signal b, FIG. 14D a power output signal k for the first power unit 1, FIG. 14E a synthesized current i given from the first and third power units 1 and 5 to the laser diode 106, and FIG. 14F a laser output waveform respectively.

The switching element 83 is turned ON by the power output signal k, a current i in a circuit from the reactor 89 to the laser diode 106 increases as indicated by the reference sign Ia according to a voltage at the DC current power unit 81, and the switching element 83 is turned OFF by rising of the first time delay signal b after the time $T_1$.

When the first time delay signal b rises, the third power unit 5 is turned ON by this signal, and a current Ib as a total value Ib of a current at the reactor 89 in the first power unit 1 and a current outputted from the third power unit 5 is supplied to the laser diode 106. With this operation, a high peak current flows in the laser diode 106.

The reactor 89 in the first power unit 1 has a comparatively small inductance, and selects an inductance value as well as a time $T_1$ of the reactor 89 and a voltage at the DC current power unit 81 so that a first rising of the laser output can be obtained concurrently when the first time delay signal b rises by the first excitation amplitude according to a current Ia increasing by the DC current power unit 81.

When the first time delay signal b rises, the switching element 83 is turned OFF, so that a period after the diode 87 is turned ON until a current Ib decided according to an inductance between the DC current power unit 85 and the reactor 87 becomes zero corresponds to the time $T_2$ of the second excitation amplitude, and thereafter and on, corresponds to a third excitation amplitude $I_3$. To change the slope in the current Ib, namely the time $T_2$, a voltage of the DC current power unit 85 or an inductance value of the reactor 89 is selected so that the time $T_1$ is a particular value.

The third power unit 5 is turned ON concurrently with the first time delay signal b, and a peak of the current Ib is, although a high current, a short period and is reduced at a specified angle, and for this reason, not much extra strain is put on the laser diode 106.

This embodiment, as described above, has a structure so simple as to turn ON/OFF a current of the first power unit 1 only once, and for this reason, the circuit is simple and is realized at low cost.

Figure 15:
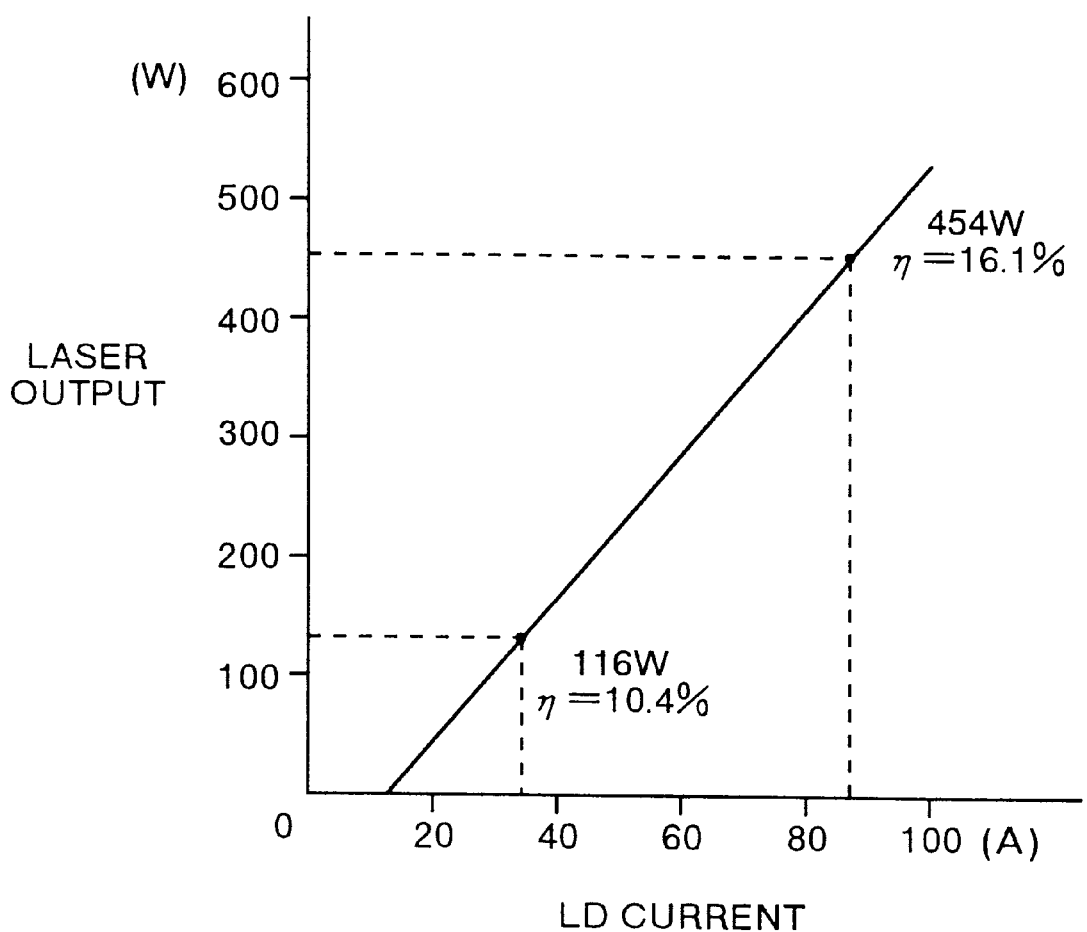
FIG. 15 is a graph showing a relation between a current for a laser diode and laser output.
Figure 16:
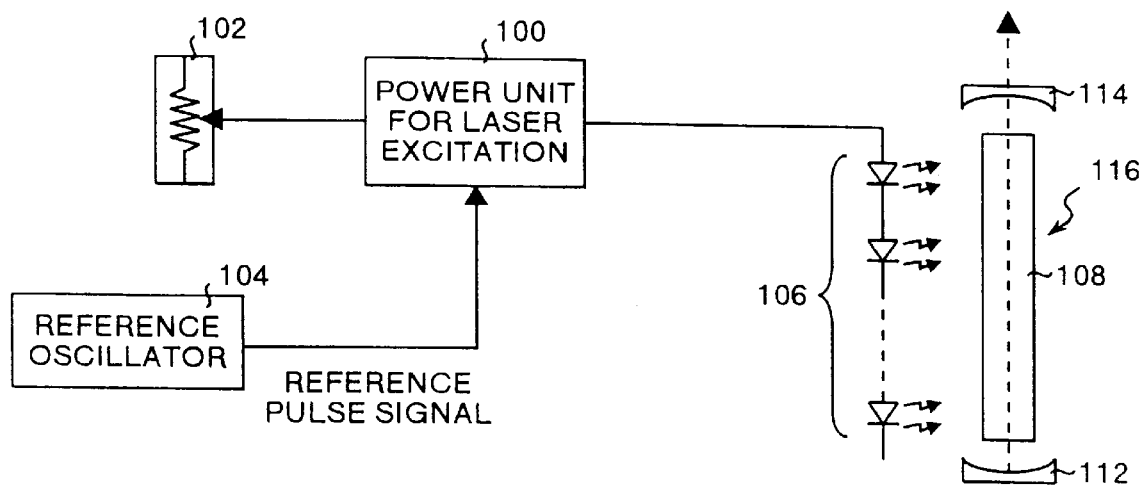
FIG. 16 is a block diagram showing the conventional type of power supply unit for exciting a pulse laser.

FIG. 15 shows laser output characteristics for a current flowing through the laser diode. As the laser diode is a semiconductor, when a continuous current flows, the limitation is around 35 A and an laser output at that time is 116 W.

As for the laser output for power inputted in the laser diode, an ON-voltage of the laser diode is 2 V, and a current efficiency when 16 pieces are connected in series is 10.4%. On the other hand, when a current is set to flow in a pulse form, the laser diode will never be damaged even if the current flows by some more times assuming that an average current is constant. When a current of 88 A as 2.5 times flows, a laser output is 454 W, the efficiency is 16.1%, which is the efficiency far higher than that by the excitation with a continuous current.

In addition, although the current is 2.5 times, the laser output becomes 3.9 times and is effected by laser oscillation with high peak pulses, so that a current efficiency is high, and a high output can be obtained with the same laser diode, improvement that a pulse laser output is given to laser machining capability is extremely high. Especially, improvement of machining capability with pulses is remarkable when the duty is lower, and an effect that all the power efficiency, activity ratio of the diode, and the machining capability can be improved is significant.

It should be noted that description of the embodiments above assumed a case where the three amplitudes such as the first, second, and third excitation amplitudes are synthesized to output from each power unit, but by storing this amplitude pattern in a memory or the like, instructing an output waveform by a program for a computer or the like, or by operating at least one power unit, the same effect can also be obtained.

Also, in the control method of exciting a pulse laser and the power supply unit for exciting a pulse laser according to the present invention, the same effect can also be obtained, other than the solid laser based on excitation of a laser diode, by some other system of laser, for example, a $CO_2$ laser as a discharge/excitation system of gas laser or a lump excitation system of solid laser.

As clearly understood from the description described above, with the invention, there are steps of exciting an exciting unit with a first excitation amplitude immediately before a laser output signal is turned ON and until the laser output signal is turned ON, exciting the exciting unit with a second excitation amplitude from a point of time immediately after the laser output signal is turned ON until a specified point of time before the laser output signal is turned OFF, and exciting the exciting unit with a third excitation amplitude from a point of time when energization according to the second excitation amplitude is ended until the laser output signal is turned OFF, so that a delay in a rising portion of laser output can be zero or extremely short: period, the laser output can rapidly reach its stationary output, and responsiveness of pulse output is improved, and for this reason machining at a high frequency and a low duty which used to be incapable of performance in the conventional type of power unit can be effected.

With the invention, a first excitation amplitude is an amount of energy required when laser output rises together with a laser output signal, so that a delay in a rising portion of laser output can be zero, and for this reason machining at a high frequency and a low duty which used to be incapable of performance in the conventional type of power unit can be effected.

With the invention, a second excitation amplitude is an excitation amplitude higher than a third excitation amplitude, and laser output according to the second excitation amplitude has been effected for a period until a value of the laser output becomes the same as a steady value of laser output according to the third excitation amplitude, so that the laser output can rapidly reach its stationary output, and responsiveness of pulse output is improved, and for this reason machining at a high frequency and a low duty which used to be incapable of performance in the conventional type of power unit can be effected.

With the invention, a first excitation amplitude is a value slightly lower than amplitude required for starting laser oscillation, so that there is no time limit and laser output can rise at almost the same time when a second excitation amplitude rise without particular controls therefor, and for this reason machining at a high frequency and a low duty which used to be incapable of performance in the conventional type of power unit can be effected.

With the invention, a first power unit operates from rising of a reference pulse signal until rising of a first time delay signal having a time delay to the reference pulse signal, a second power unit operates from rising of the first time delay signal until rising of a second time delay signal having a time delay to the first time delay signal, and a third power unit operates from rising of the second time delay signal until falling of the first time delay signal, and output by synthesizing output from the first power unit, second power unit and the third power unit is supplied to an exciting unit, so that a delay in a rising portion of laser output can be zero or extremely short period, the laser output can rapidly reach its stationary output, and responsiveness of pulse output is improved, and for this reason machining at a high frequency and a low duty which used to be incapable of performance in the conventional type of power unit can be effected.

With the invention, a current set in each of current setting devices flows in each reactor in the first power unit, second power unit, and third power unit respectively, and by providing controls for an output cutting-off section of each of the power units, the first power unit operates from rising of a reference pulse signal until rising of a first time delay signal having a time delay to the reference pulse signal, the second power unit operates from rising of the first time delay signal until rising of a second time delay signal having a time delay to the first time delay signal, and the third power unit operates from rising of the second time delay signal until falling of the first time delay signal, and output by synthesizing output from the first power unit, second power unit and the third power unit is supplied to an exciting unit, so that a delay in a rising portion of laser output can be zero or extremely short period, the laser output can rapidly reach its stationary output, and responsiveness of pulse output is improved, and for this reason machining at a high frequency and a low duty which used to be incapable of performance in the conventional type of power unit can be effected.

With the invention, through a switching operation by a switch, a first current setting device is connected to a power unit from rising of a reference pulse signal until rising of a first time delay signal having a time delay to the reference pulse signal, a second current setting device is connected to a power unit from rising of the first time delay signal until rising of a second time delay signal having a time delay to the first time delay signal, and a third current setting device is connected to a power unit from rising of the second time delay signal until falling of the first time delay signal, so that excitation to an exciting unit with a first excitation amplitude immediately before a laser output signal is turned ON and until the laser output signal is turned ON, excitation to the exciting unit with a second excitation amplitude from a point of time immediately after the laser output signal is turned ON until a specified point of time before the laser output signal is turned OFF, and excitation to the exciting unit with a third excitation amplitude from a point of time when energization according to the second excitation amplitude is ended until the laser output signal is turned OFF can be effected, and with those operations, a delay in a rising portion of laser output can be zero or extremely short period, the laser output can rapidly reach its stationary output, and responsiveness of pulse output is improved, and for this reason machining at a high frequency and a low duty which used to be incapable of performance in the conventional type of power unit can be effected.

With the invention, a first power unit operates from rising of a reference pulse signal until rising of a second time delay signal further having a time delay to a first time delay signal having a time delay to the reference pulse signal, and a third power unit operates from rising of the first time delay signal until falling of the first time delay signal, and output by synthesizing output from the first power unit and the third power unit is supplied to the exciting unit, so that excitation to an exciting unit with a first excitation amplitude immediately before a laser output signal is turned ON and until the laser output signal is turned ON, excitation to the exciting unit with a second excitation amplitude from a point of time immediately after the laser output signal is turned ON until a specified point of time before the laser output signal is turned OFF, and excitation to the exciting unit with a third excitation amplitude from a point of time when energization according to the second excitation amplitude is ended until the laser output signal is turned OFF can be effected, and with those operations, a delay in a rising portion of laser output can be zero or extremely short period, the laser output can rapidly reach its stationary output, and responsiveness of pulse output is improved, and for this reason machining at a high frequency and a low duty which used to be incapable of performance in the conventional type of power unit can be effected.

With the invention, a switching element for a first power unit is being ON from rising of a reference pulse signal until rising of a time delay signal having a time delay to the reference pulse signal, and a third power unit operates from rising of the time delay signal until falling of the time delay signal, and output by synthesizing output from the reactor and the third power unit is supplied to the exciting unit, so that excitation to an exciting unit with a first excitation amplitude immediately before a laser output signal is turned ON and until the laser output signal is turned ON, excitation to the exciting unit with a second excitation amplitude from a point of time immediately after the laser output signal is turned ON until a specified point of time before the laser output signal is turned OFF, and excitation to the exciting unit with a third excitation amplitude from a point of time when energization according to the second excitation amplitude is ended until the laser output signal is turned OFF can be effected, and with those operations, a delay in a rising portion of laser output can be zero or extremely short period, the laser output can rapidly reach its stationary output, and responsiveness of pulse output is improved, and for this reason machining at a high frequency and a low duty which used to be incapable of performance in the conventional type of power unit can be effected.

With the invention, a first excitation amplitude is an amount of energy required when laser output rises together with a laser output signal, so that a delay in a rising portion of laser output can be zero, and for this reason machining at a high frequency and a low duty which used to be incapable of performance in the conventional type of power unit can be effected.

With the invention, a second excitation amplitude is an excitation amplitude higher than a third excitation amplitude, and laser output according to the second excitation amplitude has been effected for a period until a value of the laser output becomes the same as a steady value of laser output according to the third excitation amplitude, so that the laser output can rapidly reach its stationary output, and responsiveness of pulse output is improved, and for this reason machining at a high frequency and a low duty which used to be incapable of performance in the conventional type of power unit can be effected.

With the invention, a first excitation amplitude is a value slightly lower than amplitude required for starting laser oscillation, so that there is no time limit and laser output can rise at almost the same time when a second excitation amplitude rise without particular controls therefor, and for this reason machining at a high frequency and a low duty which used to be incapable of performance in the conventional type of power unit can be effected.

This application is based on Japanese patent application No. HEI 9-301153 filed in the Japanese Patent Office on Oct. 31, 1997, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A control method of exciting a pulse laser by exciting a laser medium using an exciting unit, said method comprising the steps of:

exciting said exciting unit with a first excitation amplitude immediately before a laser output signal is turned ON and until the laser output signal is turned ON;

exciting said exciting unit with a second excitation amplitude from a point in time immediately after the laser output signal is turned ON until a specified point in time before the laser output signal is turned OFF; and exciting said exciting unit with a third excitation amplitude from a point in time when energization according to the second excitation amplitude is ended until the laser output signal is turned OFF.

2. A control method of exciting a pulse laser according to claim 1, wherein said first excitation amplitude is an amount of energy required when laser output rises together with a laser output signal.

3. A control method of exciting a pulse laser according to claim 1, wherein said second excitation amplitude is an excitation amplitude higher than said third excitation amplitude, and laser output according to said second excitation amplitude has been effected for a period until a value of the laser output becomes the same as a steady value of laser output according to said third excitation amplitude.

4. A control method of exciting a pulse laser according to claim 1, wherein said first excitation amplitude is a value slightly lower than amplitude required for starting laser oscillation.

5. A power supply unit for exciting a pulse laser by exciting a laser medium using an exciting unit, said power supply unit comprising:

a first power unit for outputting a first excitation amplitude;

a second power unit for outputting a second excitation amplitude; and a third power unit for outputting a third excitation amplitude; wherein said first power unit, said second power unit, and said third power unit are connected, and wherein said first power unit operates between a point in time when a reference pulse signal outputted from a reference oscillator changes state, until receipt of a first time delay signal having a time delay with respect to the reference pulse signal; said second power unit operates from receipt of said first time delay signal until receipt of a second time delay signal having a time delay with respect to said first time delay signal, and said third power unit operates from receipt of said second time delay signal until falling of said first time delay signal, and output by synthesizing output from said first power unit, second power unit and said third power unit is supplied to said exciting unit.

6. A power supply unit for exciting a pulse laser according to claim 5; wherein said first excitation amplitude is an amount of energy required when laser output rises together with a laser output signal.

7. A power supply unit for exciting a pulse laser according to claim 5; wherein said second excitation amplitude has an excitation amplitude higher than said third excitation amplitude, and laser output according to said second excitation amplitude has been effected for a period until a value of the laser output becomes the same as a steady value of laser output according to said third excitation amplitude.

8. A power supply unit for exciting a pulse laser according to claim 5; wherein said first excitation amplitude is a value slightly lower than amplitude required for starting laser oscillation.

9. A power supply unit for exciting a pulse laser according to claim 5; wherein said first power unit, said second power unit, and said third power unit are connected each with a preset value of a respective current setting device in parallel to a DC current power unit respectively; and each of said first power unit, said second power unit and said third power unit comprises a constant current supplying section including a serial body of a switching element for supplying a constant current and a diode connected to a side of a positive electrode of the DC current power unit for controlling a current at a reactor connected to a contact point between said switching element and said diode to be a constant, and an output cutting-off section including a serial body of a diode and a switching element for controlling cut-off of output connected to the side of the positive electrode of the DC current power unit and connecting said reactor to a contact point between said switching element and said diode; and excitation energy is supplied from said output cutting-off section to the laser diode as an exciting unit.

10. A power supply unit for exciting a pulse laser according to claim 9; wherein said first excitation amplitude is an amount of energy required when laser output rises together with a laser output signal.

11. A power supply unit for exciting a pulse laser according to claim 9; wherein said second excitation amplitude has an excitation amplitude higher than said third excitation amplitude, and laser output according to said second excitation amplitude has been effected for a period until a value of the laser output becomes the same as a steady value of laser output according to said third excitation amplitude.

12. A power supply unit for exciting a pulse laser according to claim 9; wherein said first excitation amplitude is a value slightly lower than amplitude required for starting laser oscillation.

13. A power supply unit for exciting a pulse laser by exciting a laser medium using an exciting unit, said power supply unit comprising:
   a power unit;
   a first current setting device for setting a first excitation amplitude;
   a second current setting device for setting a second excitation amplitude; and
   a third current setting device for setting a third excitation amplitude; wherein said first current setting device, said second current setting device, and said third current setting device are connected to said power unit; and
   switches each for selectively connecting one of said first to third current setting devices to said power unit; wherein, through a switching operation by said switch, said first current setting device is electrically connected to said power unit between a point in time when a reference pulse signal outputted from a reference oscillator changes state, until receipt of a first time delay signal having a time delay with respect to the reference pulse signal, said second current setting device is electrically connected to said power unit from receipt of said first time delay signal until receipt of a second time delay signal having a time delay with respect to said first time delay signal, and said third current setting device is electrically connected to said power unit from receipt of said second time delay signal until falling of said first time delay signal.

14. A power supply unit for exciting a pulse laser according to claim 13; wherein said first excitation amplitude is an amount of energy required when laser output rises together with a laser output signal.

15. A power supply unit for exciting a pulse laser according to claim 13; wherein said second excitation amplitude has an excitation amplitude higher than said third excitation amplitude, and laser output according to said second excitation amplitude has been effected for a period until a value of the laser output becomes the same as a steady value of laser output according to said third excitation amplitude.

16. A power supply unit for exciting a pulse laser according to claim 13; wherein said first excitation amplitude is a value slightly lower than amplitude required for starting laser oscillation.

17. A power supply unit for exciting a pulse laser by exciting a laser medium using an exciting unit, said power supply unit comprising:
   a first power unit for outputting a first excitation amplitude; and
   a third power unit for outputting a third excitation amplitude; wherein said first power unit and said third power unit are connected, and wherein said first power unit operates between a point in time when a reference pulse signal outputted from a reference oscillator changes state, until receipt of a second time delay signal further having a time delay with respect to a first time delay signal having a time delay with respect to the reference pulse signal, and said third power unit operates from receipt of said first time delay signal until falling of said first time delay signal, and output by synthesizing output from said first power unit and said third power unit is supplied to said exciting unit.

18. A power supply unit for exciting a pulse laser according to claim 17; wherein said first excitation amplitude is an amount of energy required when laser output rises together with a laser output signal.

19. A power supply unit for exciting a pulse laser according to claim 17; wherein said first excitation amplitude is a value slightly lower than amplitude required for starting laser oscillation.

20. A power supply unit for exciting a pulse laser by exciting a laser medium using an exciting unit, said power supply unit comprising:
   a first power unit for outputting a first excitation amplitude; and
   a third power unit for outputting a third excitation amplitude; wherein said first power unit and said third power unit are electrically connected, and wherein said first power unit comprises a serial body of a switching element provided in a side of a positive electrode of a DC current power unit and a diode provided in a side of a positive electrode of said DC current power unit, in which a reactor is connected to a contact point between said switching element and said diode, and the switching element is ON between a point in time when a reference pulse signal outputted from a reference oscillator changes state, until receipt of a time delay signal having a time delay with respect to the reference pulse signal, and said third power unit operates from receipt of said time delay signal until falling of said time delay signal, and output by synthesizing output from said reactor and said third power unit is supplied to said exciting unit.

21. A power supply unit for exciting a pulse laser according to claim 20; wherein said first excitation amplitude is an amount of energy required when laser output rises together with a laser output signal.

22. A power supply unit for exciting a pulse laser according to claim 20; wherein said first excitation amplitude is a value slightly lower than amplitude required for starting laser oscillation.

* * * * *